United States Patent [19]

Ohsawa

[11] Patent Number: 5,586,880
[45] Date of Patent: Dec. 24, 1996

[54] HEAT TREATMENT APPARATUS AND HEAT TREATMENT BOAT

[75] Inventor: Tetsu Ohsawa, Tokyo, Japan

[73] Assignees: Tokyo Electron Limited; Tokyo Electron Tohoku Limited, both of Japan

[21] Appl. No.: 452,505

[22] Filed: May 30, 1995

Related U.S. Application Data

[63] Continuation of Ser. No. 184,915, Jan. 24, 1994, abandoned.

[30] Foreign Application Priority Data

Jan. 27, 1993 [JP] Japan ................................. 5-031315

[51] Int. Cl.[6] ............................................. F23D 3/12
[52] U.S. Cl. ........................ 432/241; 432/253; 432/258; 432/5; 432/6
[58] Field of Search ................................ 432/241, 5, 6, 432/152, 253, 11, 258, 259

[56] References Cited

U.S. PATENT DOCUMENTS

| | | | |
|---|---|---|---|
| 4,802,842 | 2/1989 | Hirayama | 432/253 |
| 4,872,554 | 10/1989 | Quernemoen | 432/259 |
| 5,044,752 | 9/1991 | Thurfjell et al. | 414/416 |
| 5,054,418 | 10/1991 | Thompson et al. | 432/253 |
| 5,055,036 | 10/1991 | Asane et al. | 432/241 |
| 5,297,956 | 3/1994 | Yamabe et al. | 432/5 |
| 5,310,339 | 5/1994 | Ushikawa | 432/253 |
| 5,316,472 | 5/1994 | Niino et al. | 432/241 |

*Primary Examiner*—Raymond A. Nelli
*Attorney, Agent, or Firm*—Graham & James LLP

[57] ABSTRACT

A heat treatment boat houses a plurality of semiconductor wafers in a manner separated at intervals for heat-treating the wafers in a heat treatment furnace. The heat treatment boat includes a bottom plate, a first support rod erected on the outer peripheral edge of the bottom plate, a second support rod and a third support rod both erected on the bottom plate so as to make an central angle of 105° to 120° with the first support rod with respect to the center of the respective wafer supported by the rods, and a top plate provided opposed to the bottom plate for holding the rods. The stresses applied to the wafers housed in the heat treatment boat are distributed equivalently to three contacting points with the rods and become the minimum.

13 Claims, 9 Drawing Sheets

DISTRIBUTED SHEARING STRESS Kgf/mm² (FOUR POINT SUPPORT)

DISTRIBUTED SHEARING STRESS Kgf/mm² (THREE POINT SUPPORT)

HEAT TREATMENT APPARATUS AND HEAT TREATMENT BOAT

This is a continuation of application Ser. No. 08/184,915 filed on Jan. 24, 1994, now abandoned.

BACKGROUND OF THE INVENTION

A. Field of the Invention

The present invention relates to a heat treatment apparatus for heat-treating circular-plate like articles to be treated such as semiconductor wafers or substrates and also relates to a heat treatment boat.

B. Description of the Related Art

As one of the processes for manufacturing semiconductor wafers or substrates, heat treatment is used for forming oxidized films and diffusing dopants at a high temperature. Horizontal heat treatment furnaces were mainly used in the past, but vertical heat treatment furnaces have recently come to be mostly used, because the latter takes in little air in the atmosphere.

A heat treatment apparatus using a vertical heat treatment furnace, i.e., a vertical heat treatment apparatus employs a vertically elongated heat treatment boat (or a wafer boat) accommodating a lot of wafers vertically spaced from one another and loading them in and unloading them from the vertical heat treatment furnace. The heat treatment boat comprises a circular top plate, a circular bottom plate disposed thereunder so as to be opposed thereto and four support rods made of quartz or the like and provided between the Lop and bottom plates. Two of the four support rods are arranged at such positions that they support the right and left portions of the front end part of each wafer in view of the direction in which the wafer enters the heat treatment boat. The support rods are provided on a heat insulating tube made of a heat insulating material.

Each support is formed with horizontal grooves having a width slightly larger than the thickness of a wafer fitted in the corresponding groove so as to support the corresponding outer peripheral edge of wafer. The wafers are fitted in and taken out of horizontal grooves of the support rods by a transfer arm in a space defined between the two front support rods.

After a predetermined number of wafers have been mounted on the heat treatment boat, it is lifted by an elevator and introduced into the heat treatment furnace. Then, the wafers are loaded in the heat treating furnace, and predetermined heat treatment is performed.

In one of heat treatment processes, wafers are heated at such a high temperature as 1200° C. for a long time in order to diffuse, to a predetermined depth, dopants (impurity ions) which are formed by ion injection. When the mother material of the wafers is silicon, its yield stress at this high temperature becomes such an extremely small value as about $1/560$ of its yield stress at the normal temperature (room temperature).

The diameter of wafers has become larger from 6 inches to 8 inches, and wafers having a diameter of 12 inches are now being developed. When, however, the wafers having such a large diameter are heat-treated at a high temperature close to the melting point of the mother material of the wafers, surface defects called slip are produced at the portions supported by the support rods of the heat treatment boat. The slip is formed by minute faults which cannot be visually observed but can be found by a magnifying lens or under a microscope.

The causes of slip generation are:
(1) the internal stress due to the weight of a wafer itself and
(2) thermal distortional stress due to uneven distribution of temperature on the wafer surface.

With respect to cause (1), since the wafer is supported at its circular outer peripheral edge by heat treatment boat and thus partially supported, a large internal stress is produced by the weight of the wafer itself at the supported portions. It is considered that slip is produced when the internal stress exceeds a predetermined value.

With respect to cause (2), it is considered that slip is produced when thermal distortional stress produced by the difference of the temperature distribution between the central portion and the peripheral portions of the wafer as the temperature is raised exceeds a predetermined value.

The mechanism as to how is produced the internal stress due to the weight of the wafer, which stress is considered to be one of the causes of slip generation, will be explained more in detail in view of the structure of the conventional heat treatment boat. Each wafer is not only bent within a manufacturing tolerance but also due to uneven temperature distribution as the heating temperature is raised, and each groove of each support rod has a manufacturing error. The bending and the manufacturing errors are combined to reduce number of the supporting points of the wafer from four to three as shown in FIG. 10. When the wafer is supported at three points, the loads on the three points become unbalanced as seen from the load distribution on the wafer around the support rods shown by Xs, and a large stress exceeding the limit of slip generation is exerted on one of the supported points Xs.

A method of reducing the internal stress due to the weight of a wafer itself has been developed in which the supporting areas of the wafer are widened by using the four support rods of the heat treatment boat made arcuated along the circular peripheral edge of each wafer.

However, it takes a lot of time and cost to machine members into support rods having an arcuated cross section for ensuring a large supporting area. In addition, each wafer is not always supported evenly by the four support rods over their whole supporting areas and is likely to receive an excessive load at its local portion. Thus, it is little guaranteed that slip is effectively protected by this method.

When, therefore, wafers having a large diameter are heat treated particularly at a high temperature close to the melting point of the mother material of the wafer, there occurs a problem that slip is generated. This makes it difficult to increase the diameter of the wafer.

SUMMARY OF THE INVENTION

The object of the present invention is to provide a heat treatment apparatus and a heat treatment boat for optimizing the internal stress due to the weight of wafers themselves and reducing the generation of slip.

In order to achieve the object, one aspect of the present invention provides a heat treatment boat for housing a plurality of plate-like articles to be treated spaced apart from one another and locating the articles in a heat treatment furnace for heat-treating the articles, comprising:

a bottom plate having an outer peripheral edge portion;

a first support rod erected on the outer peripheral edge portion of the bottom plate, for supporting the articles;

second and third support rods for supporting the articles, both erected on the outer peripheral edge portion of the bottom plate on both sides of the first support rod so as to make a central angle of 105° to 120° with the first support rod with respect to a center of the articles supported by said rods, respectively; and a top plate disposed over the bottom plate so as to be opposed thereto, for holding, together with the bottom plate, the first, second and third support rods.

Another aspect of the present invention is to provide a heat treatment boat for housing a plurality of plate-like articles to be treated spaced apart from one another and locating the articles in a heat treatment furnace for heat-treating the articles, comprising:

a bottom plate having an outer peripheral edge;

a first support rod erected on the outer peripheral edge of the bottom plate;

a second support rod and a third support rod both erected on the outer peripheral edge of the bottom plate on both sides of the first support rod circumferentially separated by 105° to 120° from the first support rod, respectively; and a top plate disposed over the bottom plate so as to be opposed thereto, for holding, together with the bottom plate, the first, second and third support rods.

A further aspect of the present invention is to provide a heat treatment apparatus for heat-treating substrates to be treated, comprising:

a heat treatment furnace for housing and heat-treating said substrates; and a boat for supporting the substrates and transporting the substrates into the heat treatment furnace, and comprising a bottom plate, a top plate and three support rods which are arranged at three positions separated at equal intervals along an outer peripheral edge of each of the substrates housed in the boat.

A still further aspect of the present invention is to provide a heat treatment apparatus for heat-treating substrates to be treated comprising:

a unit for housing the substrates and heat-treating them; and a unit for supporting the substrates and transporting them into the housing and heat treating unit; and the supporting and transporting unit having three-point supporting unit for minimizing stresses applied to the substrates supported by the supporting and transporting unit.

Since an article to be treated such as a circular semiconductor is supported by three support rods, particularly at their three circumferentially substantially equidistantly separated supporting faces, the article never fails to be supported by three support rods even if the article is bent. It follows that each article to be treated is always supported at three portions at which the load due to the weight of the article is substantially evenly distributed. Thus, a large load is prevented from being applied to only one portion, and an excessive stress is not concentrated thereto, whereby the generation of slip on the article can be reduced.

DETAILED DESCRIPTION OF THE PREFERRED EMBODIMENTS

The embodiments of the present invention will be described with reference to the accompanying drawings.

Figure 1:
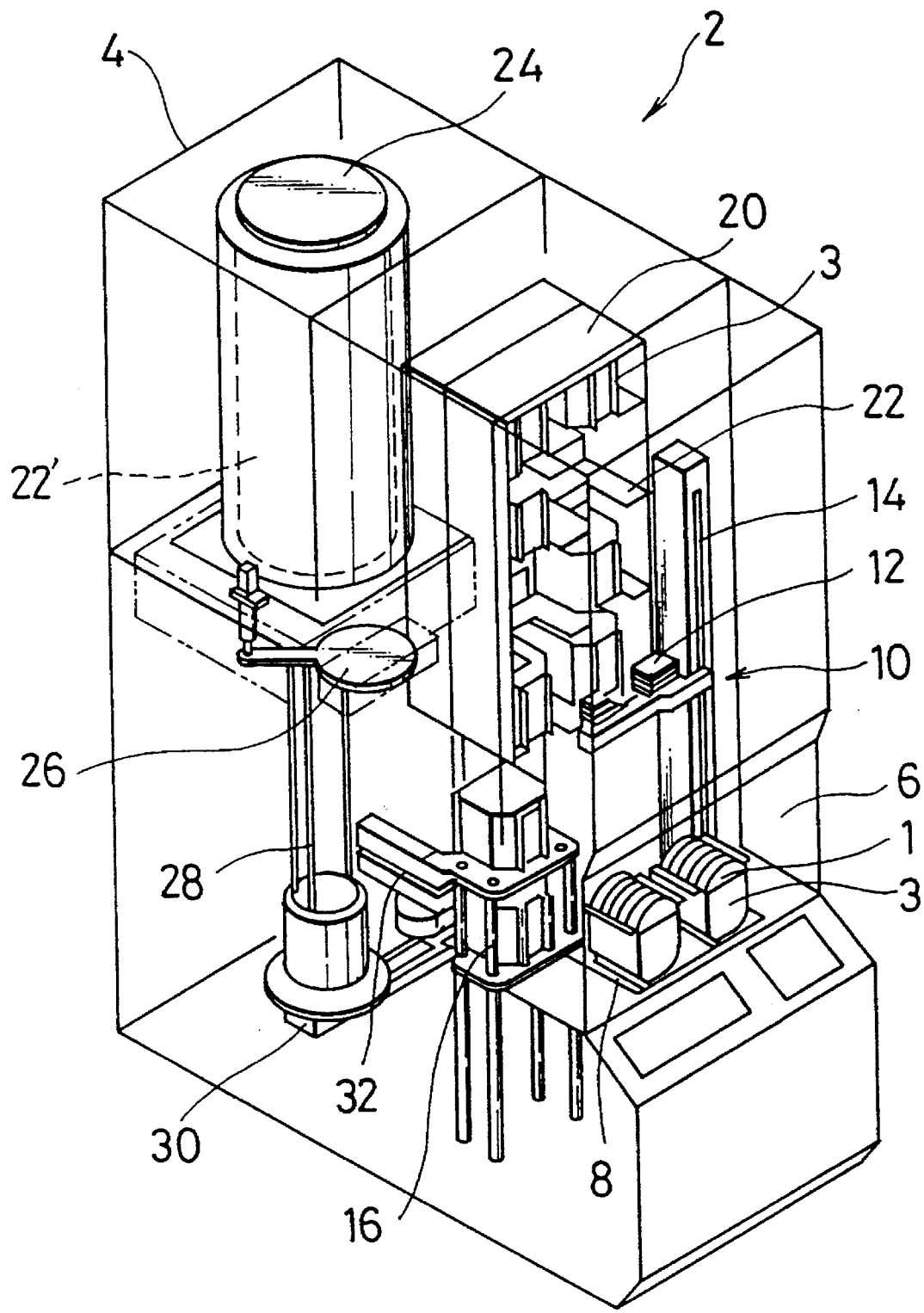
FIG. 1 is a perspective view of a heat treatment apparatus according to one embodiment of the present invention.

FIG. 1 is a perspective view of a vertical heat treatment apparatus of an embodiment according to the present invention.

As shown in FIG. 1, an I/O port 6 for transporting carriers 3 accommodating a plurality of (twenty-five, for example) semiconductor wafers 1 is provided at the front portion of tile casing 4 of a heat treatment apparatus 2. At tile lower portion of the I/O port 6 is provided a posture changing mechanism 8 for changing the posture of a wafer 1 together with the carriers 3 by 90°. At the rear portion of the I/O port 6 is provided a carrier transfer mechanism 10 for receiving the carriers 3 from the posture changing mechanism 8 and transporting tile carriers 3. The robot arms 12 of the carrier transfer mechanism 10 are lifted and lowered by a carrier elevator 14 and extends forward and shrinks rearward.

At the further rearward portion of the I/O port 6 is provided a transfer stage 16 which can hold the carriers on two stories. Above the transfer stage 16 is positioned a carrier stocker 20 having a carrier holder 22 which can hold at most eight carriers 3.

At the rear portion of the carrier stocker 20 is placed a heat treatment furnace 24 which houses a heat treating container 22'. A rotary shutter 26 is provided for opening and closing the lower opening of the heat treating furnace 24. Under the heat treatment furnace 24 is provided a wafer boat 28 which can house at most 150 wafers and is moved up and down by means of a boat elevator 30. Between the wafer boat 28 and the transfer stage 16 is disposed a transfer apparatus 32 having a plurality of (five, for example) hands for transporting the same number (five, for example) of wafers at time.

In the heat treatment apparatus 2 of this embodiment as described above, the carriers 3 each housing a plurality of (twenty-five, for example) wafers 1 are mounted on the posture changing mechanism 8 in the I/O port 6. The posture of each carriers 3 is changed by 90° and then transported to the transfer stage 16 by the carrier transfer mechanism 10 or to the carrier stocker 20. The wafers 1 in each carriers 3 are transferred to the wafer boat 28 by means of the transfer device 32.

After a predetermined number of wafers 1 have been loaded, the wafer boat 28 is lifted by the boat elevator 30. At the same time, the shutter 26 is opened and the wafer boat 28 is inserted into the heat treatment furnace 24 through its lower opening. Thereafter, the shutter 26 is closed and the wafers 1 are heat-treated by a heater in the furnace 24. After a predetermined heat treatment has been completed, the wafer boat 28 is lowered and moved from the interior of the heat treating furnace 24 to the starting position. In a predetermined time, the wafers 1 on the wafer boat 28 are returned to the corresponding carriers 3 on the transfer stage 16 by the transfer device 32.

The wafer boat 28 is formed with a lot of supporting grooves separated at predetermined vertical pitches, in order to stack the wafers 1.

A heat treatment boat according to the present invention will be described.

Figure 2:
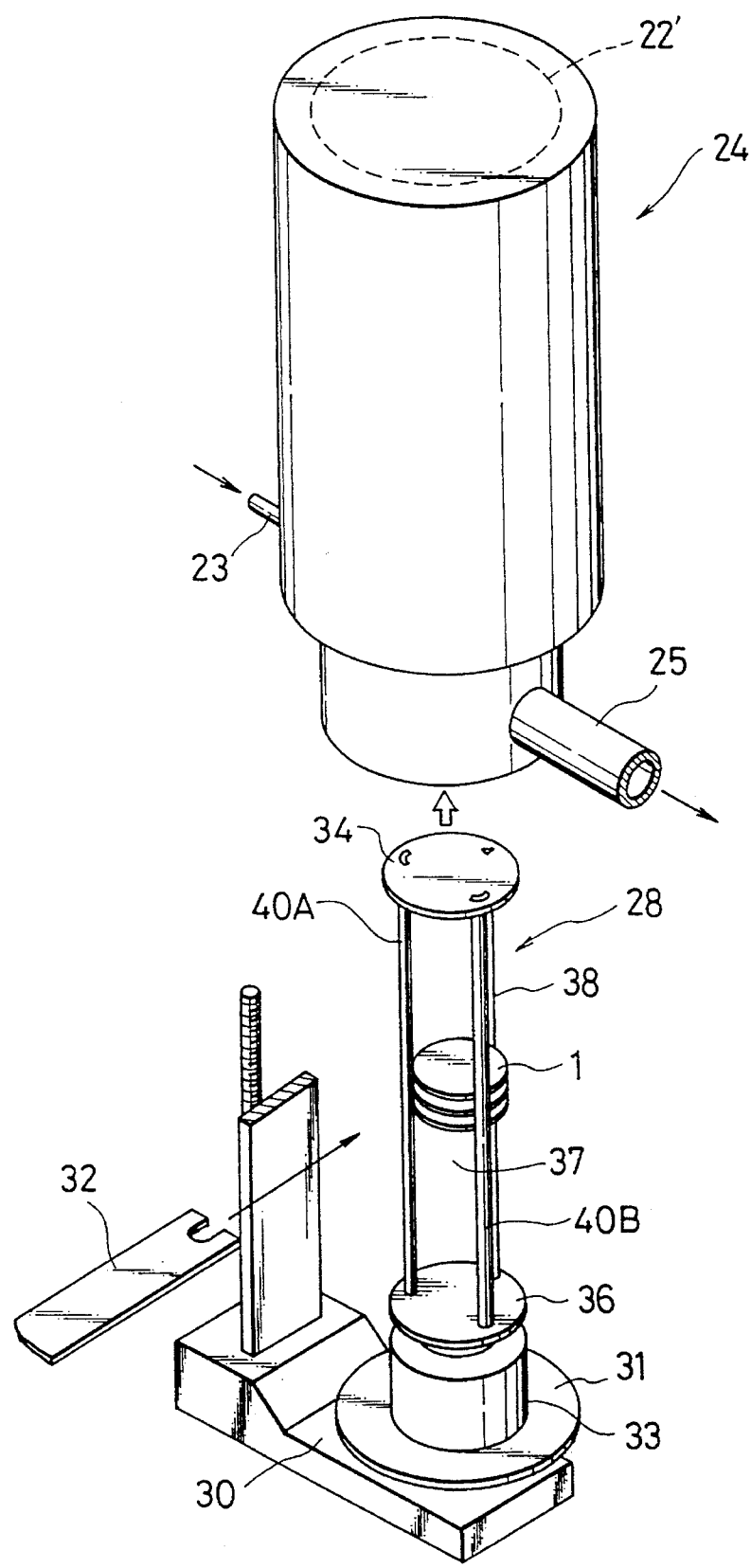
FIG. 2 is a perspective view of the main portion of the heat treatment apparatus of FIG. 1.

As shown in FIG. 2, the wafer boat 28 comprises a top plate 34, a bottom plate 36 disposed opposed under the top plate 34, and three support rods 38, 40A and 40B made of SiC or polysilicone, for example, provided between the plates 34 and 36.

The supporting rods 38, 40A and 40B correspond to first, second and third supporting rods, respectively. As will be described in detail, the supporting rods 38, 40A and 40B are arranged at the portions which divide the circumference of the top plate 34 (and the bottom plate 36) into three substantially equal parts, i.e., at the portions which divide the circumference of the wafer 1 into three substantially equal parts.

Figure 4:
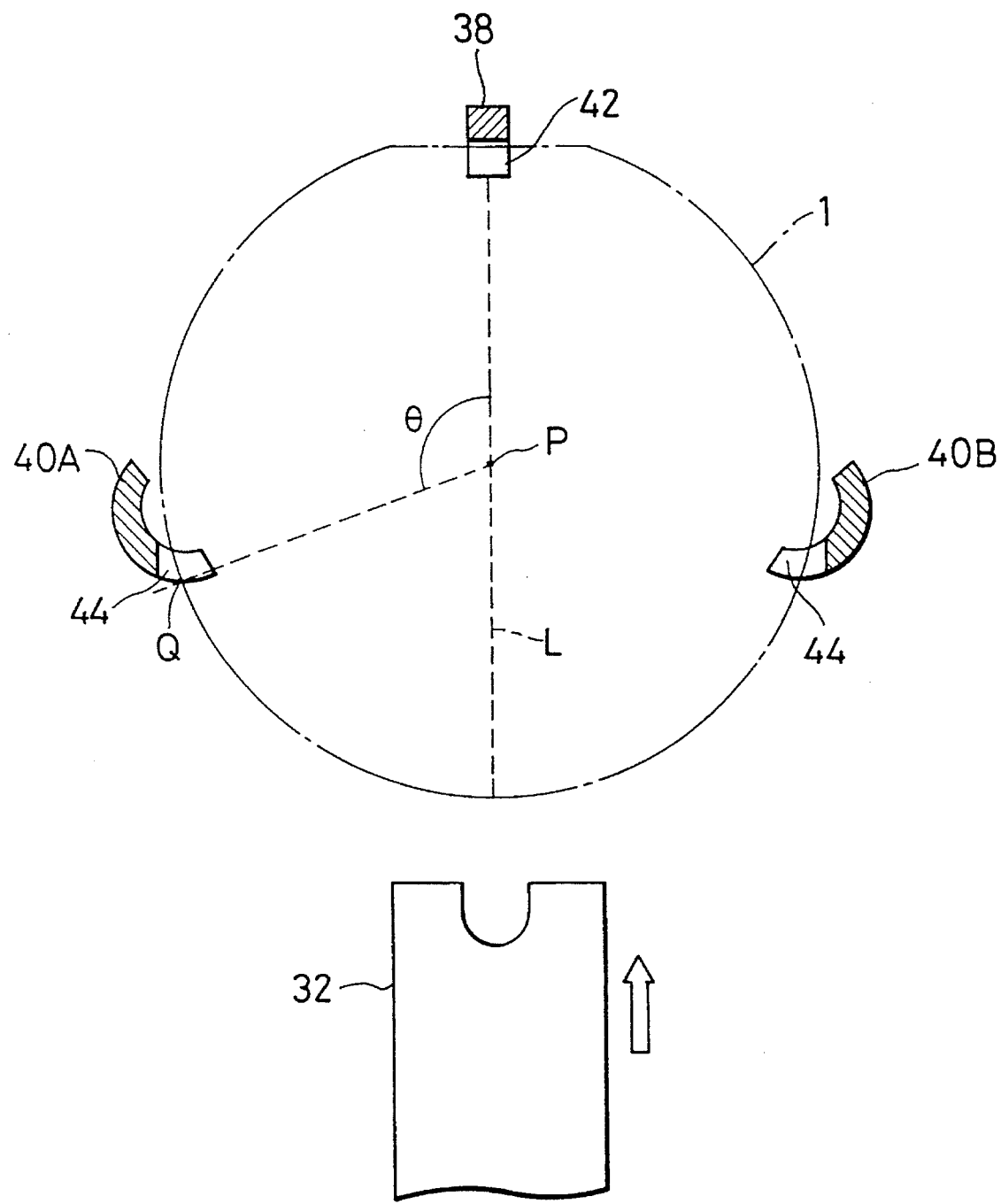
FIG. 4 is a horizontal cross-sectional view of the support rods.

Between the second and third support rods 40A and 40B is defined an entrance space 37 for admitting hands of the transfer device 32 for loading wafers 1 on and unloading the same from the wafer boat 28 (FIG. 2). As shown in FIG. 4, the first support rod 38 is positioned on a horizontal central line L of the wafer 1 along which the wafer 1 moves, and the second and third support rods 40A and 40B are arranged symmetrically with respect to the central line L at positions closer to the I/O port 6 than the first support rod 38.

As shown in FIG. 4 again, the first support rod 38 is a rectangular post having a rectangular cross section, for example, and the second and third support rods 40A and 40B are arcuated posts each having a cross section of a thick halved tube. The arcuated inner surfaces of the second and third support rods 40A and 40B are directed slightly deviated from the center P of the wafer 1 toward the first support rod 38.

Figure 3:
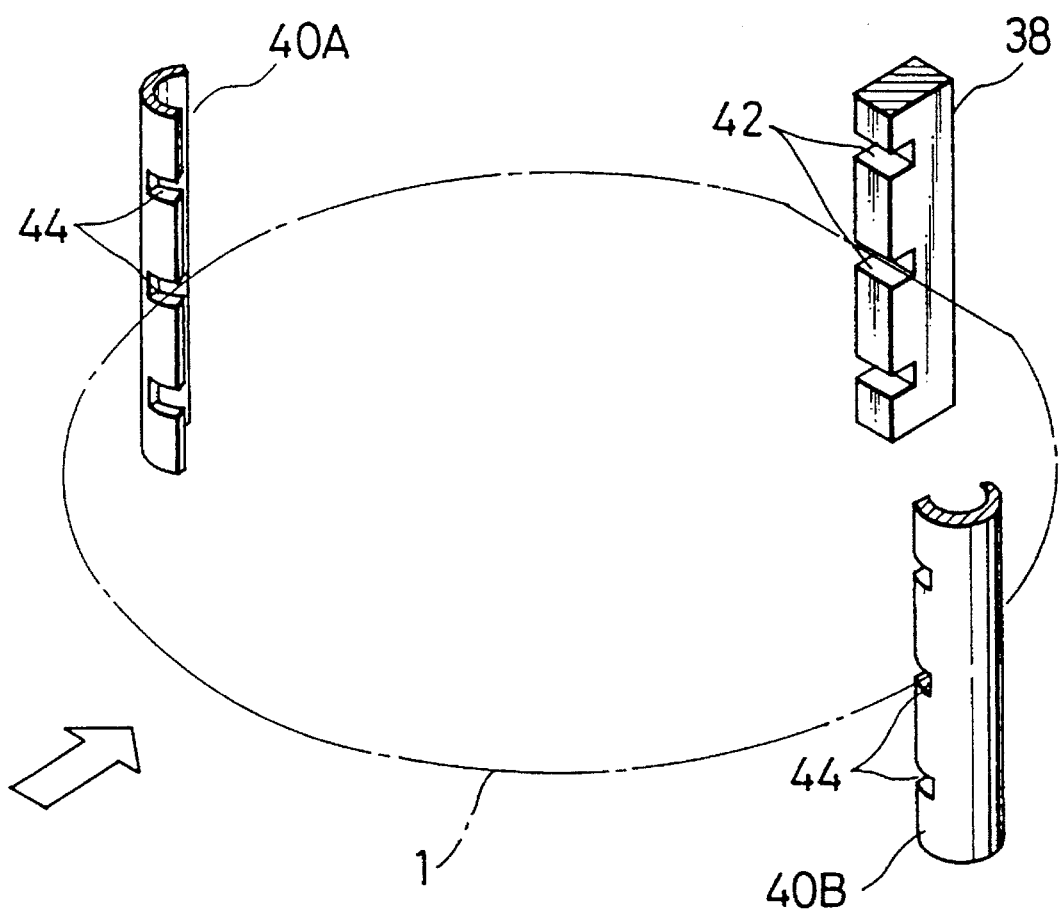
FIG. 3 is a partial view of support rods of a heat treatment boat of the embodiment of the present invention.

As shown in FIG. 3, the support rod 38 is formed with a lot of horizontal grooves 42, and the support rods 40A and 40B are formed with a lot of horizontal grooves 44 so that the grooves 38, 40A and 40b receive and support the corresponding wafers 1. The lower faces or the supporting faces of the grooves 42 and 44 for each wafer 1 are formed at the same level so that they support the corresponding wafer 1 horizontally.

Referring to FIG. 4, the groove 42 of the first support rod 38 has a width of 15 mm and a depth of 10 mm when viewed from the side of the wafer 1. Each of the second and third support rods 40A and 40B comprises a semi-tubular member having an outer diameter of 23 mm and a thickness of 8 mm. Each of the grooves 42 and 44 of the second and third support rods 40A and 40B is formed so that the inner wall of the groove is disposed slightly outside of that locus of the outermost edge of the corresponding wafer 1 which is drawn as the wafer 1 is loaded and unloaded. The height of each of the grooves 42 and 44 is about 2.5 mm so as to allow the wafer 1 is moved upward or downward when the wafer 1 is loaded and unloaded.

The positional, relationship between the wafer 1 and the supporting faces of the grooves 42 and 44 will be described.

It is preferred that a line connecting the center of the wafer 1 with a portion of the supporting face of each of the grooves 44 of the second and third supporting rods 40A and 40B make an angle θ of 105° to 120° with a line connecting the center P with the center of the correspond supporting face of the groove 42 of the first support rod 38 (the angle being hereinafter referred to as the "central angle"). Let it be assumed that the outer edge of the supporting face of a groove 44 of the second support rod 40 and the outer peripheral edge of the wafer 1 coincide at a point Q. In this embodiment, the angle defined between the line PQ and the line connecting the center of the wafer 1 with the center of the supporting face of the corresponding groove 42 of the first support rod 38 1s taken as the angle θ and set to 105° to 120°.

Figure 13:
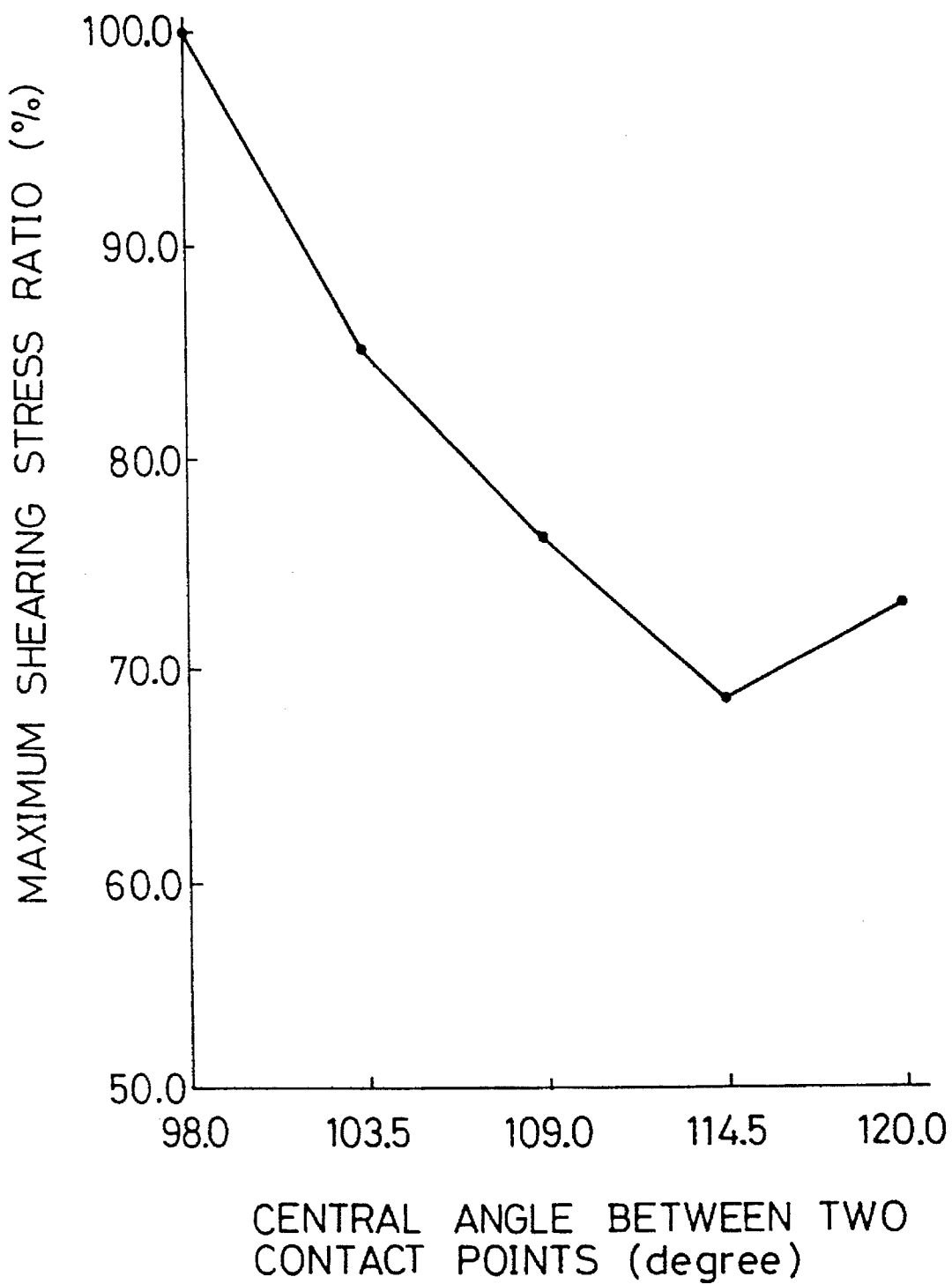
FIG. 13 is a graph showing the relationship between the central angle between the adjacent supporting points and the maximum shearing stress.

FIG. 13 shows a graph showing the relationship between the central angle θ and the maximum shearing stress ratio, in which the maximum shearing ratio is 100% at θ=98°. As understood from the graph, the maximum shearing stress ratio is less than 80% in the range of θ=105° to 120°, and the ratio is the minimum at 8 θ=114.5°.

The more inner portion of the wafer 1 is supported, the less is the stress applied to the wafer 1. In order to do so, the outer peripheral edge of the wafer 1 is separated from the supporting faces of the corresponding grooves 42 and 44 by making the inner portions of the supporting faces of the grooves lower than the outer portions 1 hereof.

Figure 12:
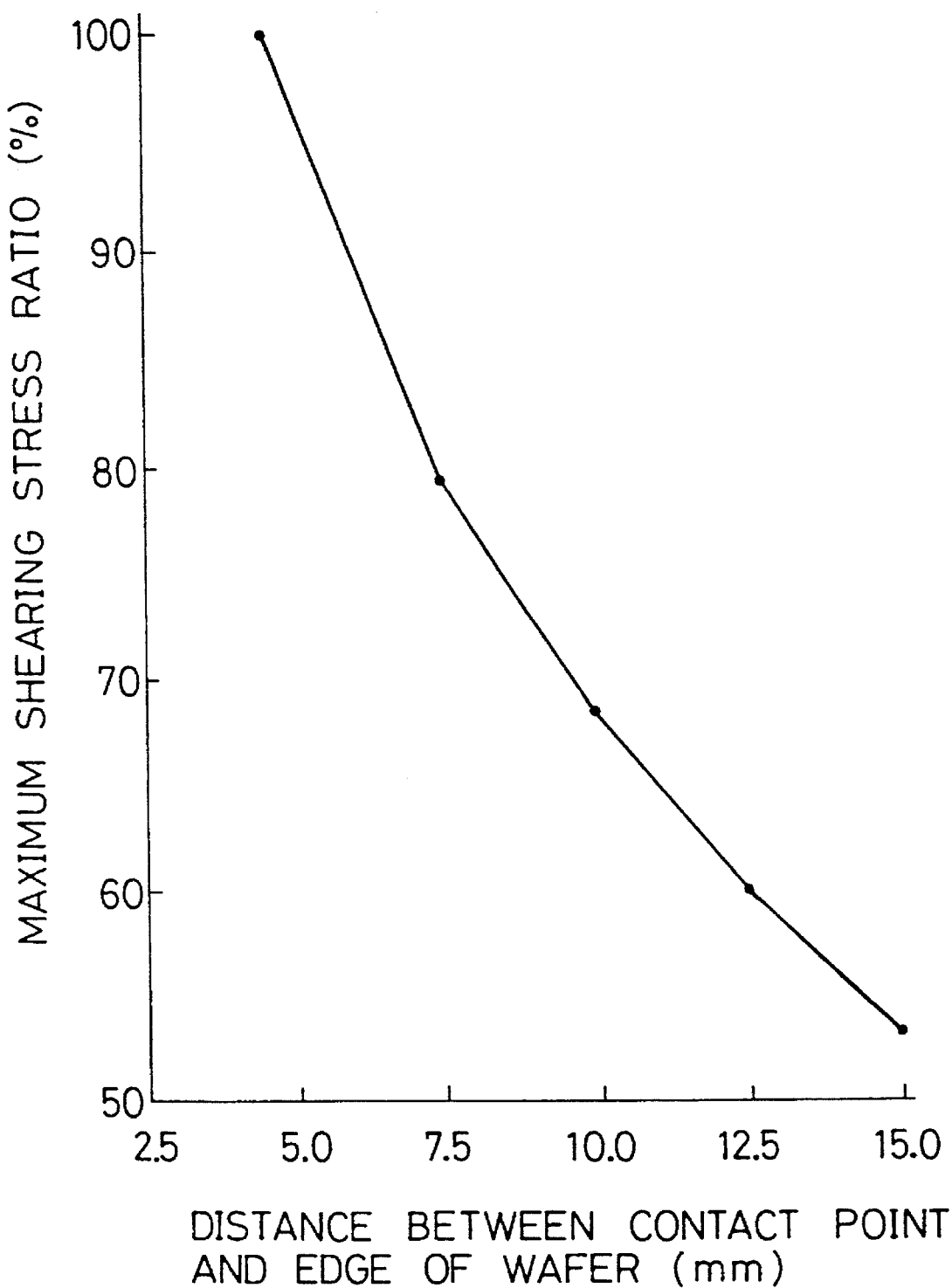
FIG. 12 is a graph showing the relationship between the distance between the edge and a supporting point and the maximum shearing stress.

FIG. 12 is a graph showing the relationship between the maximum shearing stress ratio and a distance between the contacting point of the wafer with the supporting face of the groove and the outer peripheral edge of the wafer, in which the maximum shearing stress ratio is 100% at a distance of the contacting point of 5 mm. It is understood that the maximum shearing stress ratio is reduced to about 47% at the distance of the contact point of 15 mm.

Figure 5:
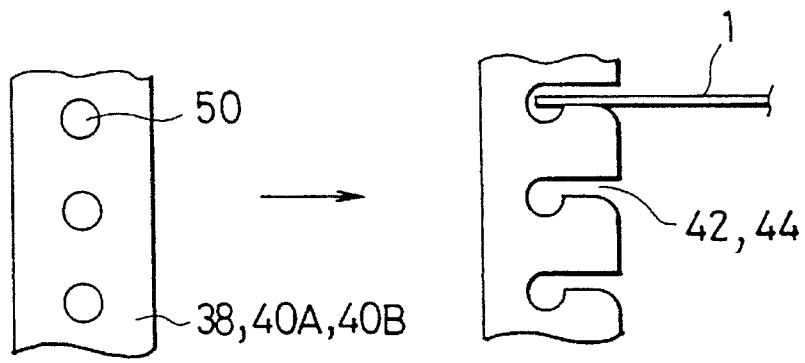
FIG. 5 shows an example how to form grooves in the support.
Figure 6:
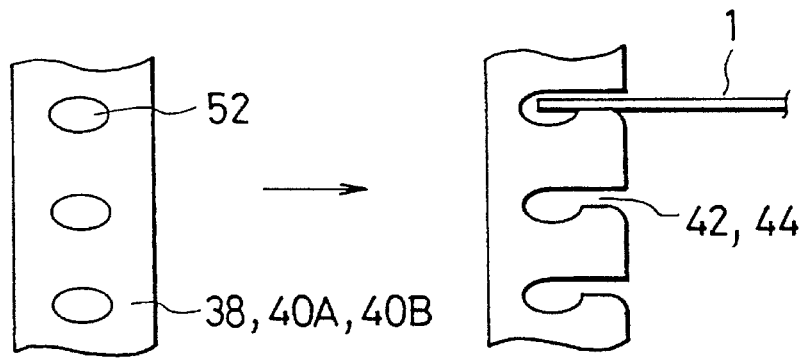
FIG. 6 shows another method of forming the grooves.
Figure 7:
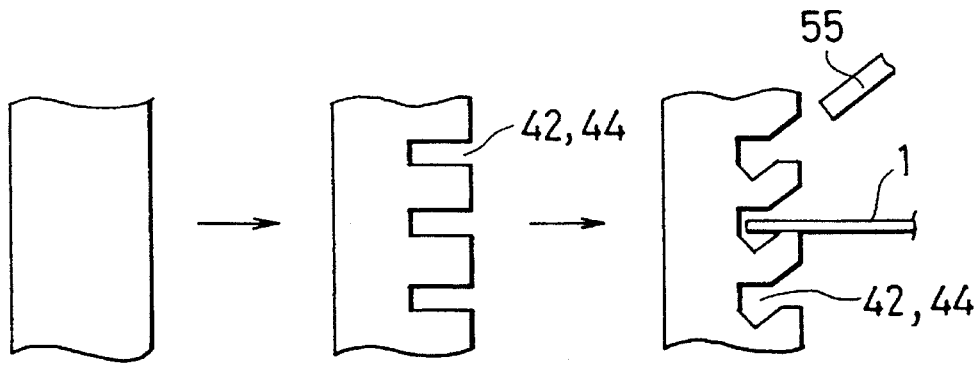
FIG. 7 shows a further method of forming the grooves.

FIGS. 5 to 7 show how to form and shape the grooves.

in the embodiments of FIGS. 5 and 6, circular holes 50 and oval holes 52 are formed in the support rods 38, 40A and 40B, respectively, so as to extend in a direction crossing the direction of the thickness of the support rods 38, 40A and 40B, and slits are formed so as to extend from the inner edge of the support rods to the holes 50 and 52, thereby forming notched grooves 42 and 44 with which the outer peripheral edges of the wafers 1 are not in contact. The opening edges of the supporting faces of the grooves 42 and 44 are chamfered into a round form.

In the embodiment of FIG. 7, horizontal groove portions are formed In the support rods 38, 40A and 40B first, and then groove portions inclined upward toward inner surface of the support rods are formed by means of an inclined cutter 55 so as to form completed grooves 42 and 44 as shown in the right support rod. These grooves are formed In the temporary baking step prior to the regular baking step.

As shown in FIG. 2, the wafer boat 28 having the structure as described above is removably mounted on the heat insulating tube 33 provided on the lower end with a flange. The heat insulting tube 33 is disposed on the boat elevator 30, and the vertical heat treatment furnace 24 is placed over the wafer boat 28. To the heat treating container or reaction tube 22' in the vertical heat treatment furnace 24 are connected a gas supplying tube 23 for supplying a predetermined gas to the reaction tube 22' and a gas exhausting tube 25 for exhausting the gas from the reaction tube 22'.

The operation of the embodied heat treatment apparatus will be described.

Untreated wafers 1 are placed in the wafer boat 28 from the entrance space 37 defined between the second and third support rods 40A and 40B by means of the hands 32 of the transfer device or the transfer arms 28, and then inserted, into the respective grooves 42 and 44. The wafers 1 are transferred to the wafer boat 28 by lowering the hands 32 slightly with respect to the wafer boat 28. In this way, the center of the orientation flat of each wafer 1, for example, is supported by the supporting face of the corresponding groove 42 of the first support rod 38, and both side edge portions of the wafer 1 with respect to its entering direction are supported by the supporting faces of the corresponding grooves 44 of the second and third support rods 40A and 40B. As already explained, the wafer 1 is supported at slightly inside portions of its outer peripheral edge.

Loading and unloading of wafers 1 are carried out from the top stage to the lowest stage of the wafer boat 28 in turn. After 150 wafers, for example, have been mounted on the wafer boat 28, the boat elevator 30 is lifted and the wafers 1 are placed in the vertical heat treatment furnace 24. For example, in order to perform heat treatment at about 1200° C., the interior of the vertical heat treatment furnace 24 is previously heated to 800° C. After the wafers 1 have been loaded, the interior of the furnace 24 is heated to 1200° C. to perform predetermined heat treatment. Thereafter, the boat elevator 30 is lowered to unload the wafers 1 from the furnace 24. Then, the wafers 1 are taken out of the wafer boat 28 in the reverse steps to the wafer loading steps on the wafer boat 28.

Figure 10:
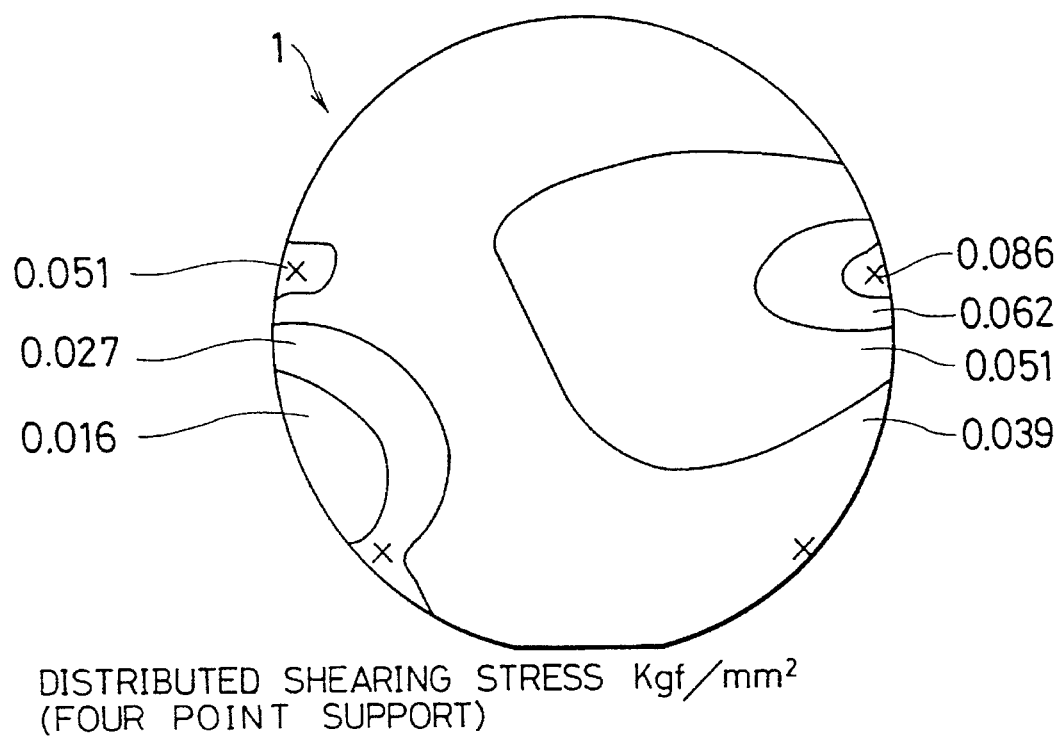
FIG. 10 shows stress distribution on a wafer supported by a conventional four-point support boat.
Figure 11:
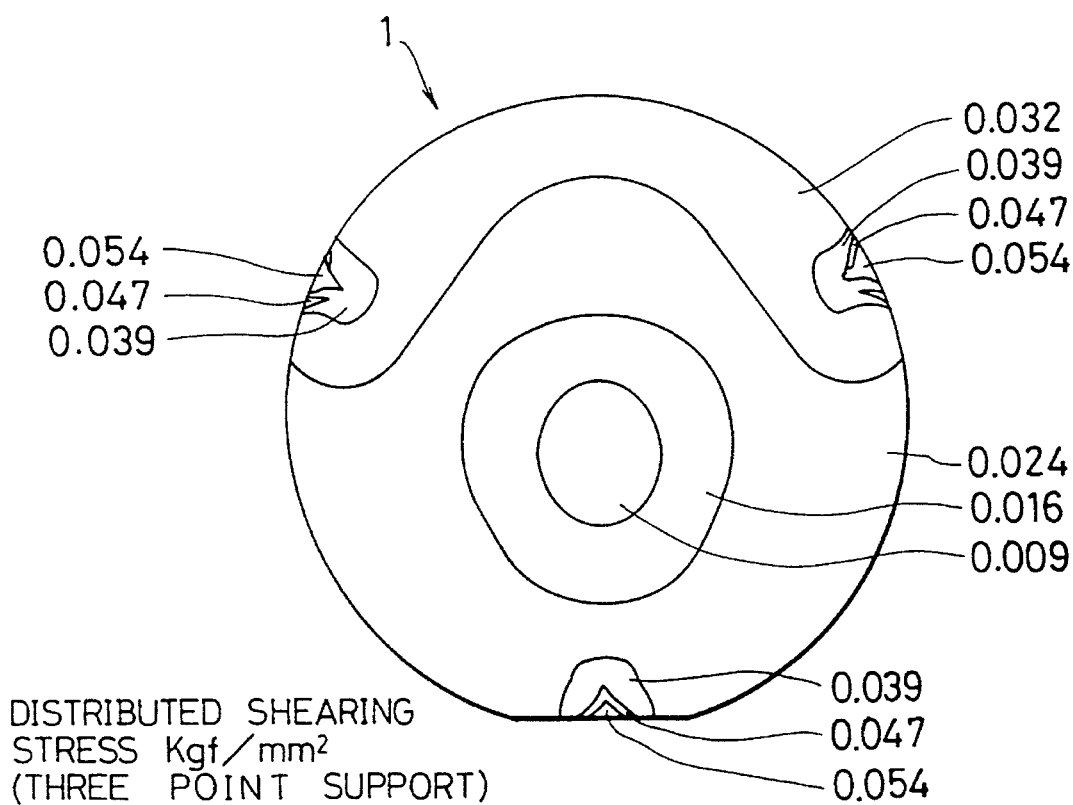
FIG. 11 shows stress distribution on a wafer supported by a three-point support boat according to the present invention.

Since the three supporting faces of the wafer boat 28 for each wafer 1 are arranged at substantially equal intervals on the outer peripheral edge of the wafer 1 in this embodiment, the wafer 1 is supported well by the three supporting faces, i.e., three-point support of the wafer 1 is attained effectively even if the wafer 1 is bent and/or there are manufacturing errors in the levels of the supporting faces of the grooves 42 and 44. As compared with the four-point support type wafer boat used in the conventional vertical furnace as shown in FIG. 10, the three-point support type wafer boat according to the present invention carries a large load on each supporting surface, if the four-point support is perfectly attained in the conventional case. However, the four-point support by the conventional wafer boat is likely to be unbalanced greatly so that an excessive load is applied to a special supporting face so as to generate a large stress in the wafer at this supporting face. With the wafer boat 28 according to the present invention, such unbalanced localized stress is not produced in the wafer 1, thereby reducing generation of slip in the wafer 1. The melting point of silicon is 1,410° C. Thus, when silicon wafers are heat-treated at about 1,000° C., the three-point support structure of the wafer boat according to the present invention is very effective and useful.

The second and third supporting rods 40A and 40B are halved tubular members. Thus, the supporting faces of the grooves of the supporting rods 40A and 40B can be disposed inside of the wafer 1 by making the central angle (the opening angle between the first support rod 38 and the second or third support rod 40A or 40B) θ large, thereby reducing stresses applied to the wafer 1. When, on the contrary, grooves extending along the entering loci of the wafers are formed in the support rods having a rectangular or circular cross section, it is a disadvantage that very little thickness is left in the supporting rods. Alternatively, it can be considered that necessary thickness is given to the supporting rods by disposing them more outside of the wafers. However, such an arrangement is not preferable because it makes the outer diameter of the heat treatment boat large.

The relationship between the opening angle (central angle) between the first support rod 38 and the second or third support rod 40A or 40B was studied in the following way.

Figure 8:
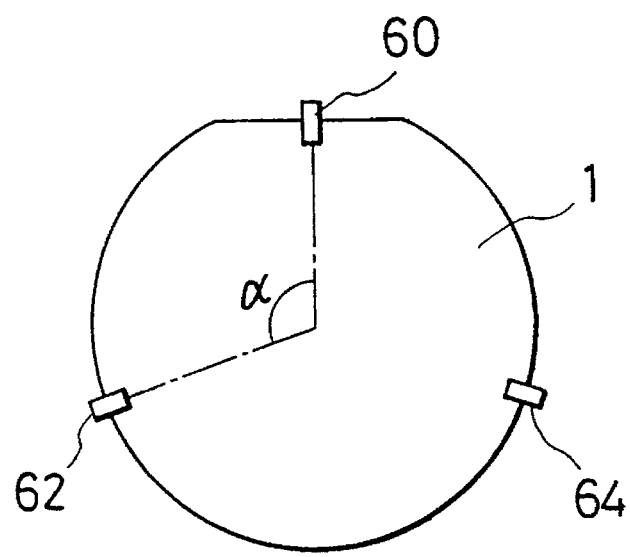
FIG. 8 shows a central angle between the adjacent support rods.

As shown in FIG. 8, a rectangular chips 60, 62 and 64 corresponding to the first, second and third support rods 38, 40A and 40B were arranged so that a line connecting the center of the wafer 1 with the center of the rectangular chip 60 and a line connecting the center of the wafer 1 with center of the chip 62 or 64 made an opening angle (central angle) α. The wafers 1 disposed on these supporting chips 60, 62 and 64 were heat-treated in the same way as in the above-mentioned embodiment and the surfaces of the wafers 1 were observed.

The opening angles (central angles) were 95°, 100°, 105° and 110°. Slip is reduced slightly at 105° and reduced remarkably at 110°. Further, no slip generation Was observed in some samples. Therefore, it is necessary to arrange supporting parts of the supporting faces of the first to third supporting rods 30, 40A and 40B at substantially equal intervals along the outer peripheral edge of the wafer 1. More concretely, the opening angle α, i.e., the central angle θ between the supporting part of a supporting face of the first support rod 38 and the supporting part of the corresponding face of the second or third support rod 40A or 40B with respect to the center of the wafer 1 is preferably 105° to 120°.

Figure 9:
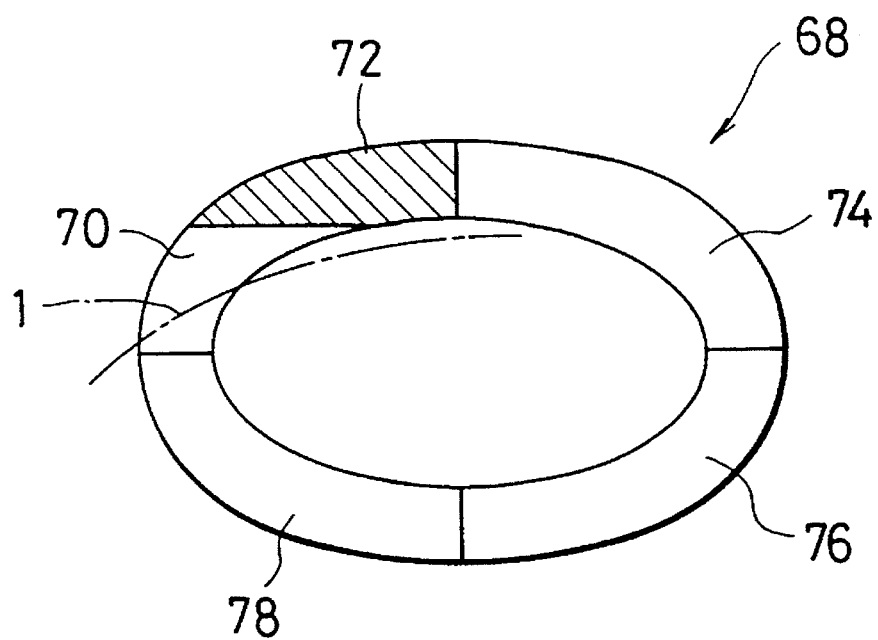
FIG. 9 shows an example how to manufacture the support.

The structure of the support rods is not limited to that of the above-mentioned embodiment. As shown in FIG. 9, an oval tubular member 68 may be divided into four sections 72, 74, 76 and 78 and these sections may be used as the second and third support rods. In this case, as representatively shown in the section 72, a groove 70 which allows the outer peripheral edge of wafer 1 to be inserted thereinto is formed in each section. The structure permits the supporting faces of the grooves 70 in the second and third support rods to support portions of the wafer 1 inside of its outer peripheral edge in a state in which ample thickness is left in the second and third support rods.

The present invention is not limited by the aforementioned embodiments but is naturally applicable to various modifications within the scope of the present invention.

What is claimed is:

1. A heat treatment apparatus for heat-treating substrates to be treated, comprising:

a heat treatment furnace for housing and heat-treating said substrates; and boat means for supporting said substrates and transporting said substrates into said heat treatment furnace, and comprising a bottom plate, a top plate and three support rods which are disposed at predetermined intervals from one another along an outer peripheral edge of each of said substrates housed in said boat means, said three support rods including a first support rod having a rectangular cross section supporting each of said substrates at an orientation flat, and a second and a third support rod provided on both sides of said first support rod, each of said second and third support rods being a hollow substantially halved tube having an arcuated cross section defined by curved outer and inner surfaces, each of said first, second and third support rods having notched grooves, and each formed with a lower face on which a corresponding one of said substrates sits.

2. A heat treatment apparatus according to claim 1, wherein said boat means is made of SiC or polysilicone.

3. A heat treatment apparatus according to claim 1, wherein said support rods are disposed on said outer peripheral edge of each of said substrates at such positions that stresses applied to said each of said substrates become the minimum.

4. A heat treatment apparatus according to claim 1, wherein said first support rod is disposed in front of said substrates with respect to an entering direction in which said substrates enter said boat means, said second and third support rods are provided on both sides of said first support rod, and said second and third support rods define therebetween an entrance space through which said substrates enter said boat means.

5. A heat treatment apparatus according to claim 1, wherein each of said lower faces is inclined downward radially outward.

6. A heat treatment apparatus according to claim 1, wherein said second and third support rods are erected on an outer peripheral edge portion of said bottom plate on both sides of said first support rod so as to make a central angle of 105° to 120° with said first support rod with respect to a center of said substrates housed in said boat means, respectively.

7. A heat treatment apparatus according to claim 1, wherein said second and third support rods are arranged so as to make a central angle of substantially 114.5° with said first support rod with respect to a center of said substrates housed in said boat means.

8. A heat treatment apparatus according to claim 1, wherein an edge of said lower face of each of said notched grooves is chamfered.

9. A heat treatment apparatus according to claim 5, wherein each of said notched grooves comprises a round hole and a slit.

10. A heat treatment apparatus according to claim 5, wherein each of said notched grooves comprises an oval hole and a slit.

11. A heat treatment apparatus for heat-treating substrates to be treated comprising:

means for housing said substrates and heat-treating said substrates; and means for supporting said substrates and for transporting said substrates into said housing, said supporting and transporting means having three-point supporting means for minimizing stresses applied to said substrates supported by said supporting and transporting means, said supporting and transporting means having a bottom plate, a top plate and three support rods arranged at three positions separated at intervals along said outer peripheral edge of each of said substrates housed in said supporting and transporting means, two of said three support rods erected on said bottom plate so as to make a central angle of 105° to 120° with the remaining support rod with respect to a center of said substrates housed in said supporting and transporting means, each of said two of said three support rods being a hollow substantially halved tube having an arcuated cross section defined by curved outer and inner surfaces, each of said three support rods having notched grooves, each formed with a lower face having a tip portion for supporting a corresponding one of said substrates, and said lower faces of said three support rods for supporting the same substrate being placed on the same horizontal plane.

12. A heat treatment apparatus for heat-treating substrates to be treated, comprising:

a heat treatment furnace for housing and heat-treating said substrates; and boat means for supporting said substrates and for transporting said substrates into said heat treatment furnace, and comprising a bottom plate, a top plate and three support rods arranged at three positions separated at predetermined intervals along an outer peripheral edge of each of said substrates housed in said boat means, said three support rods including a solid first support rod having a rectangular cross section, and a second and a third support rod provided on both sides of said first support rod, each of said first, second and third support rods has notched grooves each formed with a lower face having a portion for supporting corresponding one of said substrates, said lower faces of said first, second and third support rods for supporting the same substrate are formed on the same plane, each of said lower faces being inclined downward radially outward, each of said second and third support rods being a hollow substantially halved tube having an arcuated cross section defined by curved outer and inner surfaces, each of said first, second and third support rods having notched grooves, and each formed with a lower face having a tip portion for supporting a corresponding one of said substrates at an inner region thereof.

13. A heat treatment apparatus for heat-treating substrates to be treated, comprising:

a heat treatment furnace for housing and heat-treating said substrates; and boat means for supporting said substrates and transporting said substrates into said heat treatment furnace, and comprising a bottom plate, a top plate and three support rods which are disposed at predetermined intervals from one another along an outer peripheral edge of each of said substrates housed in said boat means, said three support rods including a solid first support rod for supporting each of said substrates at an orientation flat, and a second and a third support rod provided on both sides of said first support rod, each of said second and third support rods being a hollow tube divided lengthwise having a curved cross section defined by curved outer and inner surfaces, each of said first, second and third support rods having notched grooves, and each formed with a lower face on which a corresponding one of said substrates sits.

* * * * *